United States Patent
Tani et al.

[11] Patent Number: 5,169,741
[45] Date of Patent: Dec. 8, 1992

[54] METHOD FOR FORMING HIGH SENSITIVITY POSITIVE PATTERNS EMPLOYING A MATERIAL CONTAINING A PHOTOSENSITIVE COMPOUND HAVING A DIAZO GROUP, AN ALKALINE-SOLUBLE POLYMER, A COMPOUND CAPABLE OF ADJUSTING THE PH TO 4 OR LESS AND A SOLVENT

[75] Inventors: Yoshiyuki Tani, Neyagawa; Masayuki Endo, Izumi, both of Japan

[73] Assignee: Matsushita Electric Industrial Co., Ltd., Osaka, Japan

[21] Appl. No.: 696,994

[22] Filed: May 3, 1991

Related U.S. Application Data

[63] Continuation of Ser. No. 417,482, Oct. 5, 1989, abandoned.

[30] Foreign Application Priority Data

Oct. 11, 1988 [JP] Japan .................. 63-255112

[51] Int. Cl.⁵ .......................... G03F 7/30; G03C 1/61
[52] U.S. Cl. ..................... 430/326; 430/165; 430/189; 430/191; 430/330; 430/945
[58] Field of Search .............. 430/325, 326, 330, 165, 430/189, 191, 945

[56] References Cited

U.S. PATENT DOCUMENTS

| | | | |
|---|---|---|---|
| 4,036,644 | 7/1977 | Kaplan | 430/326 |
| 4,284,706 | 8/1981 | Clecak et al. | 430/191 |
| 4,499,171 | 2/1985 | Hosaka et al. | 430/192 |
| 4,624,908 | 11/1986 | Schwartzkopf | 430/326 |
| 4,808,512 | 2/1989 | Schwartzkopf | 430/326 |
| 4,837,124 | 6/1989 | Wu | 430/192 |
| 4,873,169 | 10/1989 | Erdmann | 430/326 |
| 4,910,123 | 3/1990 | Endo et al. | 430/326 |
| 4,912,018 | 3/1990 | Osuch et al. | 430/270 |

Primary Examiner—Charles L. Bowers, Jr.
Assistant Examiner—Christopher G. Young
Attorney, Agent, or Firm—Stevens, Davis, Miller & Mosher

[57] ABSTRACT

The present invention provides a method for forming resist patterns for exposure to a KrF excimer laser of 248.4 nm. The method includes supplying a pattern-forming material containing a photosensitive compound having a diazo group as a photosensitive group, an alkaline soluble polymer, and a solvent capable of solving the photosensitive compound and the polymer, with the pattern-forming material being adapted to a pH of 4 or less, onto a substrate to form a film. The pattern-forming material applied on the substrate is exposed to a light of about 248.4 nm. The exposed pattern-forming material is developed with an alkaline developing solution. The pattern-forming material contains a compound capable of releasing an acid when exposed to light of about 248.4 nm. The substrate is baked between the exposure and developing steps. The compound capable of releasing the acid is selected from an onium salt and a nitrobenzyl tosylate compound.

5 Claims, 7 Drawing Sheets

F I G. 3
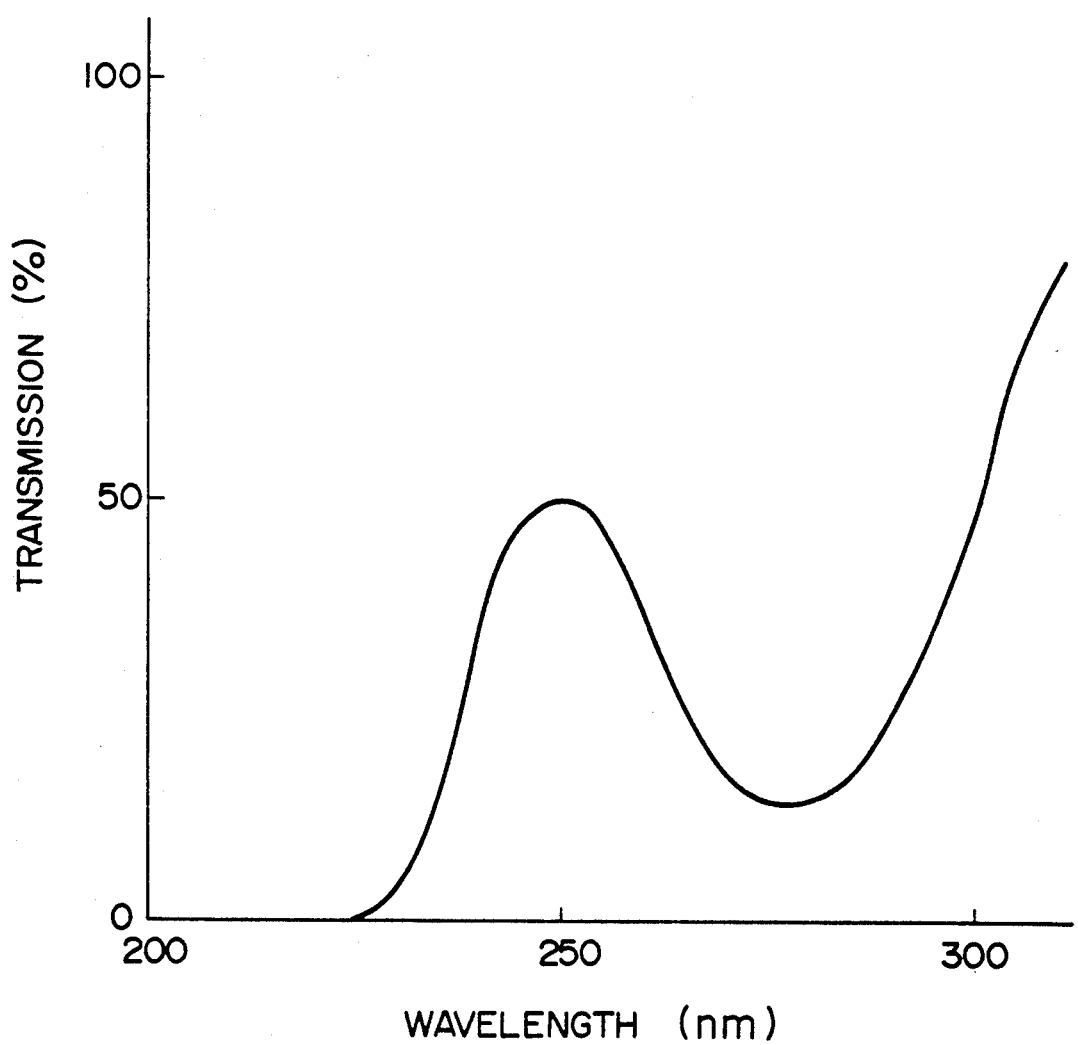

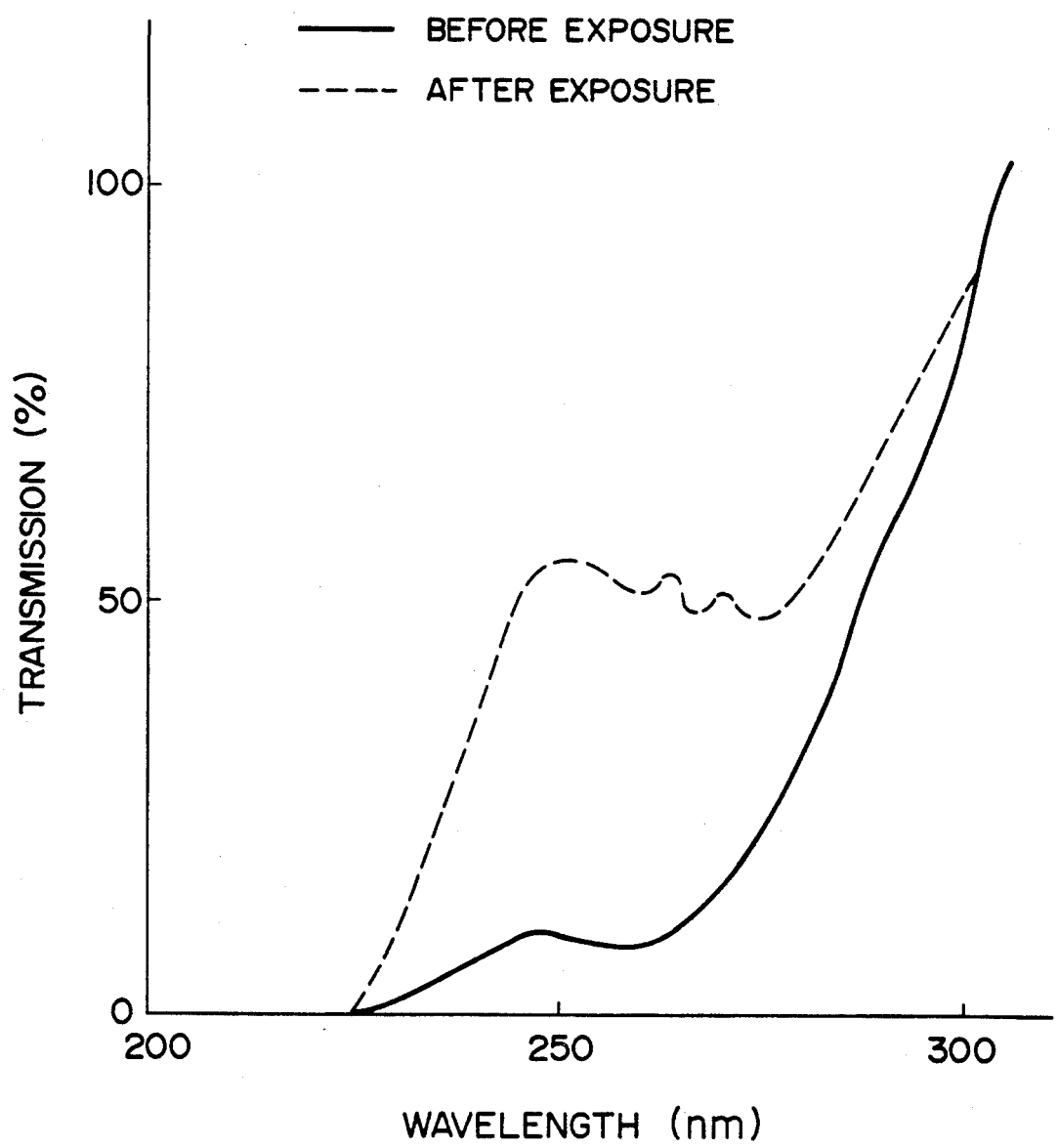

METHOD FOR FORMING HIGH SENSITIVITY POSITIVE PATTERNS EMPLOYING A MATERIAL CONTAINING A PHOTOSENSITIVE COMPOUND HAVING A DIAZO GROUP, AN ALKALINE-SOLUBLE POLYMER, A COMPOUND CAPABLE OF ADJUSTING THE PH TO 4 OR LESS AND A SOLVENT

This application is a continuation of application Ser. No. 07/417,482, filed Oct. 5, 1989, abandoned.

BACKGROUND OF THE INVENTION

1. Field of the Invention

The present invention relates to a method for forming patterns using as an exposure energy source, for example, a KrF excimer laser of 248.4 nm or far ultraviolet rays, wherein positive patterns are produced.

2. Statement of the Prior Art

As semiconductor devices have become highly dense and highly integrated in recent years, a wavelength used in exposure devices for minute processing, especially for photolithography is getting shorter and shorter and, research has now extended even to KrF excimer laser light (248.4 nm). However, a resist suited for this wavelength has not yet been found.

Even in the case of using, for example, MP2400 (Shipley Co., Ltd.) which is currently well known and believed to be considerably highly sensitive to KrF excimer laser light and also to have a good transmission, pattern 5a after development is seriously inferior as shown in FIG. 1 and does not appear to be usable.

A cause for such poor patterns is due to poor photoreactivity of a photosensitive material in the resist. In general, photosensitive materials of naphthoquinonediazide type which have been used for conventional resists do not show a large change in transmission to a light of about 248.4 nm. In the case of MP2400 having a layer thickness of, for example, 1.0 μm, a change before and after exposure to KrF excimer laser (248.4 nm) is merely several % at 248.4 nm as shown in FIG. 2. A UV spectral curve of novolak resin having a layer thickness of 1.0 μm is shown in FIG. 3; as is clearly noted from comparison with FIG. 3, the reactivity of the naphthoquinonediazide type resist is inferior in reactivity. As a result, its sensitivity and transmission are low so that good resist patterns are not obtained.

It has thus been desired to develop new resists showing better reactivity with excimer laser light of 248.4 nm.

SUMMARY OF THE INVENTION

An object of the present invention is thus to provide a method for forming patterns using pattern-forming materials having a good reactivity with an excimer laser light, especially KrF excimer laser light of 248.4 nm, whereby positive patterns are obtained.

Another object of the present invention is to provide a method for forming patterns using highly sensitive pattern-forming materials in a simple manner by controlling pH level.

That is, the present invention relates to a method for forming patterns which comprises:

a step of applying a pattern-forming material containing a diazo group as a photosensitive group which has a pH level of not greater than 4 onto a substrate to form a film;

a step of exposing the pattern-forming material to a light of about 248.4 nm; and, a step of developing the exposed pattern-forming material with an alkaline developing solution.

BRIEF DESCRIPTION OF THE DRAWINGS

FIG. 3 shows a UV spectral curve for novolak resin.

FIGS. 5 and 7 show respective UV spectral curves of an example of the pattern-forming material of the present invention.

DETAILED DESCRIPTION OF THE PREFERRED EMBODIMENTS

In order to solve the problem encountered in the prior art, a pH level of pattern-forming materials are adjusted to 4 or less or compounds that generate acids upon exposure are used in the present invention so that decomposition of the diazo group by exposure is accelerated.

In general, pattern-forming materials are comprised of photosensitive compounds containing a diazo group as a photosensitive group, alkali-soluble resin represented by novolak resin or poly-p-vinylphenol and solvents such as ethyl cellosolve acetate, ethyl lactate, etc. that can dissolve the former two compounds.

As the photosensitive compound containing a diazo group, there are well known naphthoquinonediazosulfonic acid ester compounds and 2-diazo-1,3-dione compounds. Photoreactions of these compounds are shown by the following equations.

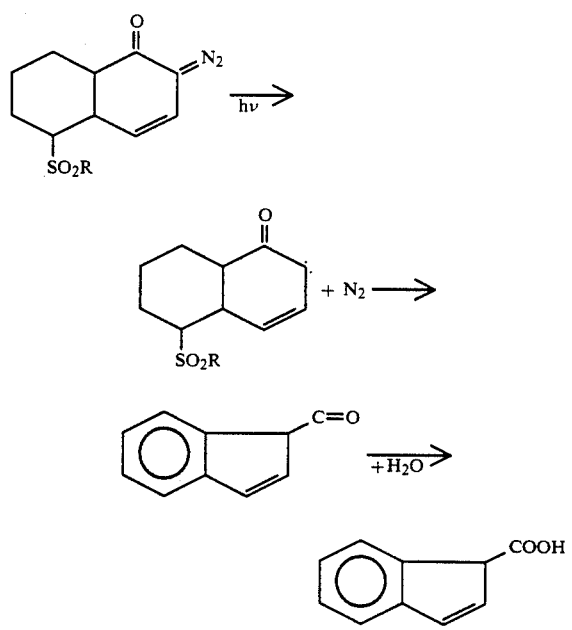

-continued

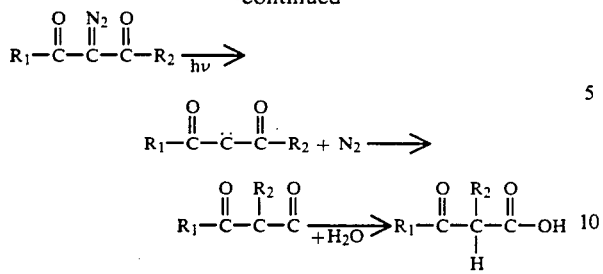

As is Clear from the above equations, these photosensitive compounds are exposed to light to split the diazo group off so that absorption becomes poor in the ultraviolet and far ultraviolet regions and at the same time, carbene generates. Then intramolecular rearrangement occurs to form a carbonyl group(s). The carbonyl groups react with water in pattern-forming materials or developing solutions to form carboxylic acids. The carboxylic acids are readily dissolved in the developing solutions which are alkaline aqueous solutions, because they possess water-soluble groups. On the other hand, at the unexposed areas the photosensitive compounds cause a coupling reaction with —OH group in alkali-soluble resins to prevent the solubility of alkali-soluble resins in the developing solutions. As a result, the resins are not dissolved in the developing solutions. That is, the pattern-forming materials used in the present invention are of positive type in which only the exposed areas are dissolved out in the developing solutions.

Figure 1:
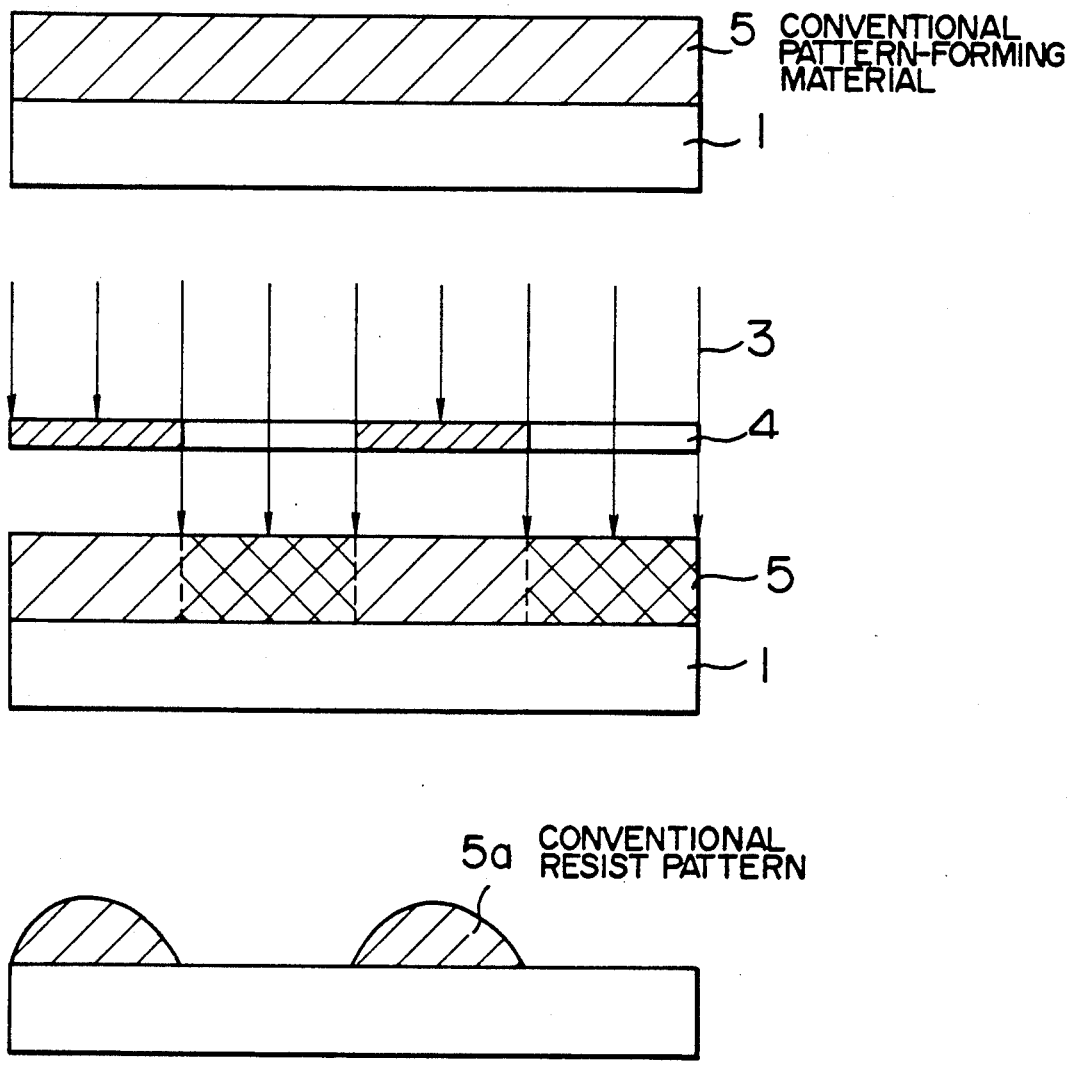
FIG. 1 shows a cross sectional view of a resist in the process of forming patterns using a conventional pattern-forming material.
Figure 2:
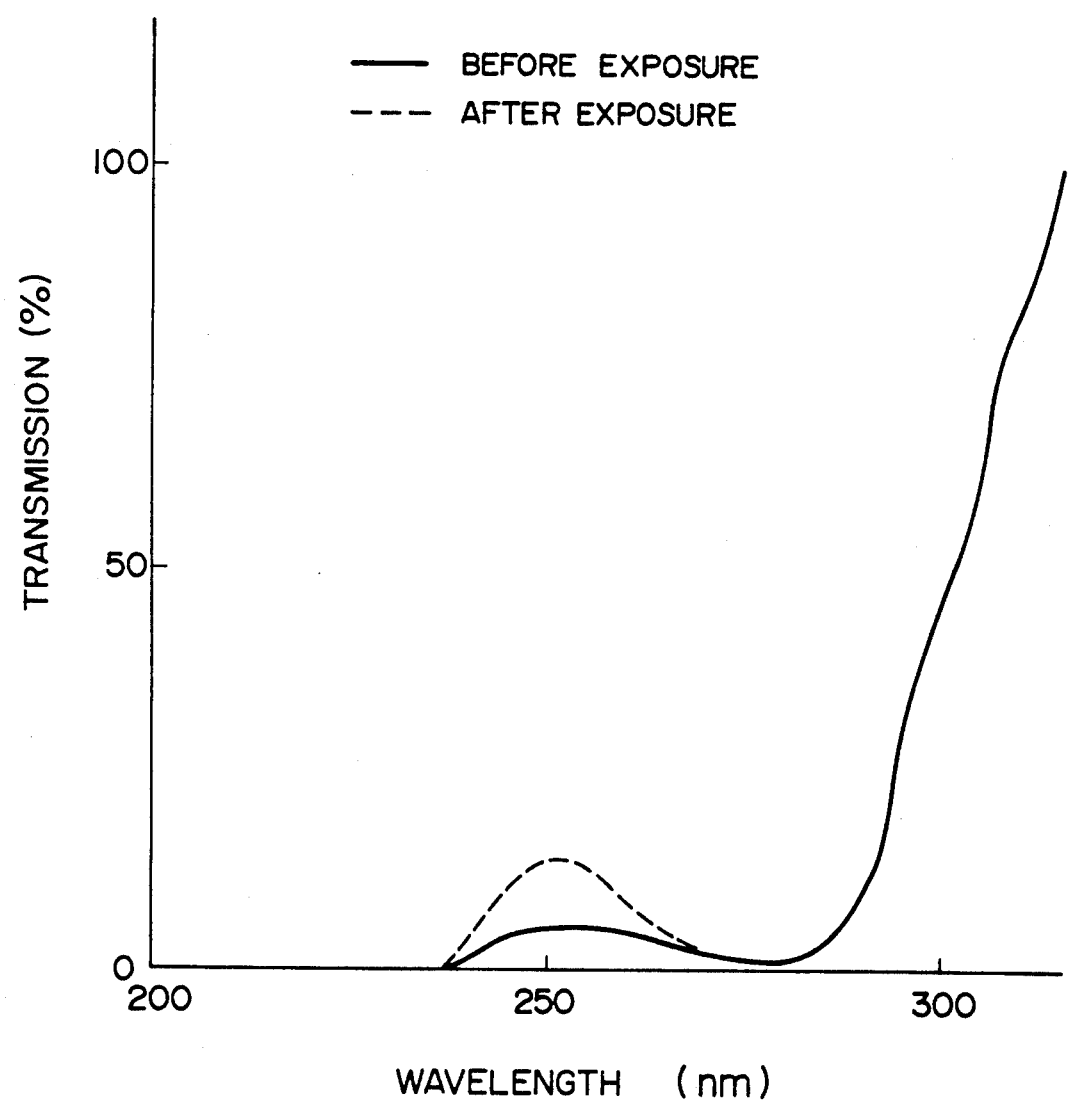
FIG. 2 shows a UV spectral curve for conventional pattern-forming material.

In order to form fine patterns having a good shape and high sensitivity, it is necessary and indispensable that the exposed area be so transparent to the light used for exposure that the exposure light sufficiently reaches the pattern-forming material to its bottom. As shown in FIG. 2, however, the conventional pattern-forming material for KrF excimer laser fails to have the exposed area having sufficient transparency to the exposure light. This is because the aforesaid elimination of the diazo group does not occur sufficiently in the conventional pattern-forming material.

Paying attention to the fact that conventional pattern-forming materials are in an almost neutral range (pH of 6.5 to 7.5), the present inventors have made investigations regarding the effects of pH change in the elimination reaction described above and as a result, have found that pattern-forming materials accelerate the elimination reaction in a acidic atmosphere.

Under the acidic atmosphere, the diazo group is attracted to $H^+$ and hence, the elimination reaction occurs at a relatively small exposure amount. As a result, a reaction efficiency of the photosensitive compound increases to realize high sensitivity and high transparency.

To adjust the pH of the pattern-forming material to 4 or less, an acidic solvent is used, an acidic resin is used, an acidic compound is added, etc. The present inventors have confirmed that any of these means contribute to achieving high sensitivity and high transparency.

In case that compounds (onium salts, nitrobenzyl tosylate compounds, etc.) capable of generating acids upon exposure to light are incorporated into the pattern-forming material, the elimination of the diazo group under the acidic condition is accelerated at the exposed area alone but the unexposed area is not exposed to the acidic condition. Therefore, the diazo group is in a stable state. That is, a much greater difference is caused between the exposed area and the unexposed area because of dissolution rate and transparency so that fine patterns having a better shape can be formed. Illustrative examples of the onium salts are shown below:

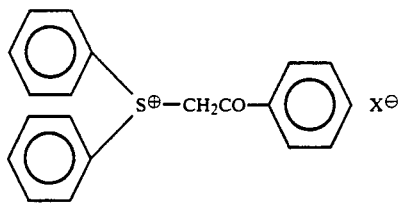

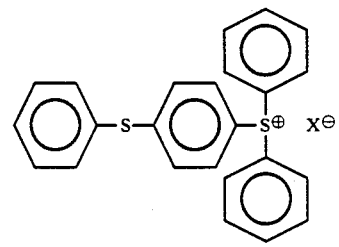

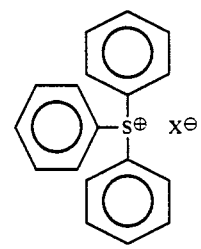

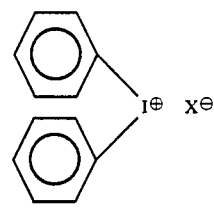

$X = AsF_6$ or $SbF_6$

The present inventors have further found that by introducing a step of baking the substrate at the exposed area after exposure, the released acid can be diffused to the bottom of the pattern-forming material and higher sensitivity can be attained.

The present invention provides a method for forming excellent resist patterns for, e.g., KrF excimer laser of 248.4 nm. When the resist is used as a resit for exposure to, e.g., KrF excimer laser light or deep ultraviolet rays (deep UV), highly sensitive fine patterns of submicron order having a good shape can readily be obtained. These fine patterns are of great value in formation of ultrafine patterns in the semiconductor industry.

Next, the present invention is described in more detail by referring to the examples below but is not deemed to be limited to these examples.

EXAMPLE 1

A reagent was prepared in the following composition, which was made a pattern-forming material.

| (1,2,4-Naphthoquinone-diazosulfonic acid chloride) | 3 g |
| Novolak resin | 7 g |
| Ethyl cellosolve acetate | 15 g |
| Acetic acid | 5 g |

Since acetic acid which is a solvent is acidic, a pH value of this pattern-forming material is 4.

Figure 4:
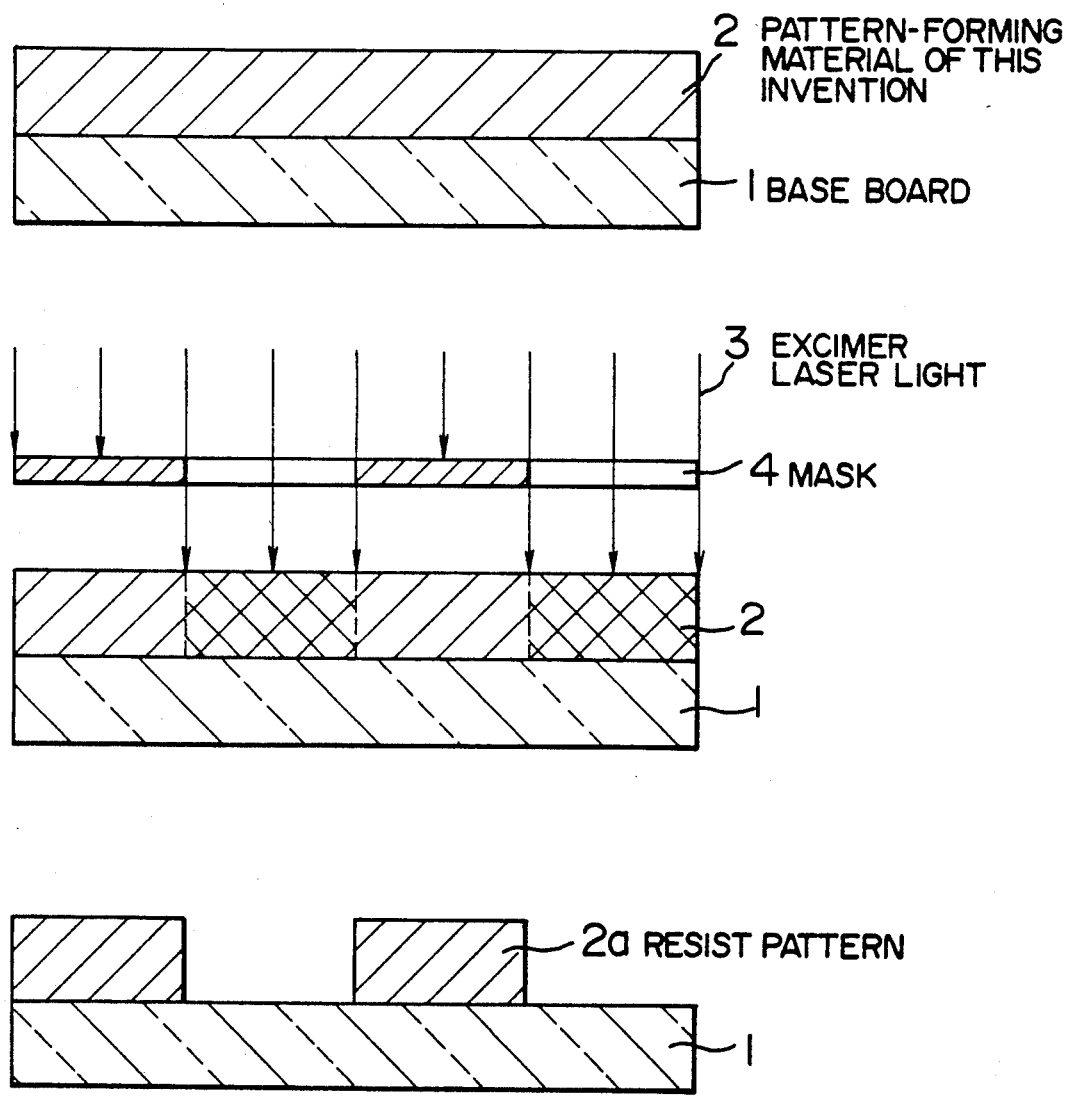
FIG. 4 shows a cross sectional view of a resist in the process of forming patterns using an example of the pattern-forming material of the present invention.

The method for forming patterns using an example of the pattern-forming material in accordance with the present invention was explained by referring to FIG. 4. The pattern-forming material 2 in accordance with the present invention was applied onto substrate 1 such as a semiconductor board, etc. by roll coating to give a resist film having a thickness of 1.0 μm (FIG. 4 (a)). In many cases, an oxidation layer, an insulating layer, a conductive layer, etc. are formed on substrate 1. Then, pattern-forming material 2 was selectively subjected to pulse exposure to KrF excimer laser light of 248.4 nm through mask 4 (FIG. 4 (b)). Finally, by developing with an alkaline developing solution, the exposed area alone of the pattern-forming material 2 was dissolved out and removed to give resist pattern 2a (FIG. 4 (c)). In this resist pattern 2a showed a good shape having an aspect ratio of 90° and its sensitivity was as high by twice as 50 J/cm² when compared to a conventional resist.

Figure 5:
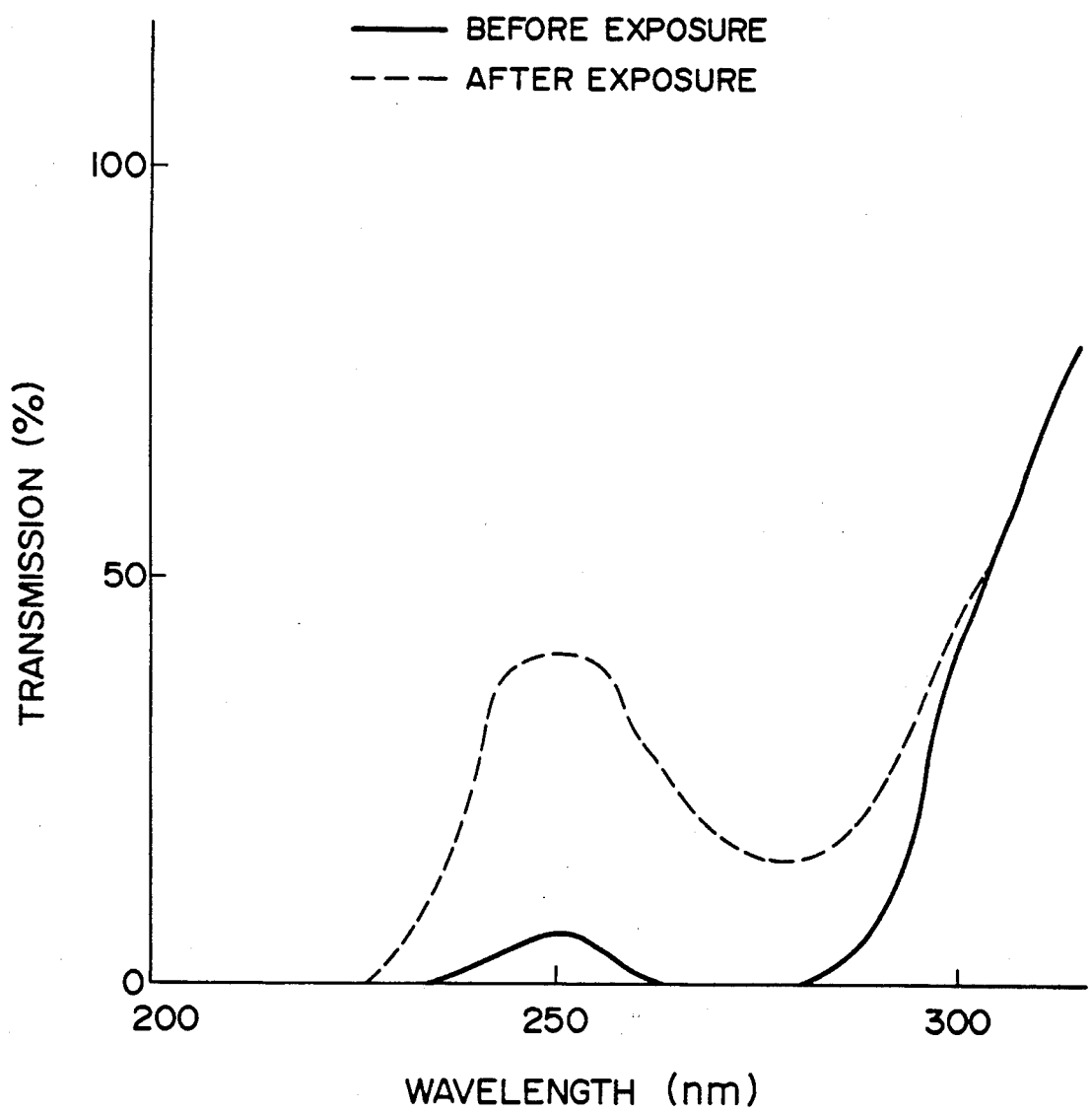

FIG. 5 shows a UV spectral curve of this pattern-forming material before and after exposure. As is evident from comparison with about 15% in the conventional resist shown in FIG. 2, the transmission after exposure reveals good reactivity of the pattern-forming material in accordance with the present invention.

By using acetic acid as a solvent for the pattern-forming material, the pH of the present invention becomes 4. After applying the pattern-forming material to the substrate by roll coating and soft baking, the solvent is substantially evaporated off and removed. However, the acetic acid remaining in the thin layer of the pattern-forming material is ionized to $CH_3COO^-$ and $H^+$. As shown in the following equation, $H^+$ attracts the diazo group contained in the photosensitive compound of the pattern-forming material:

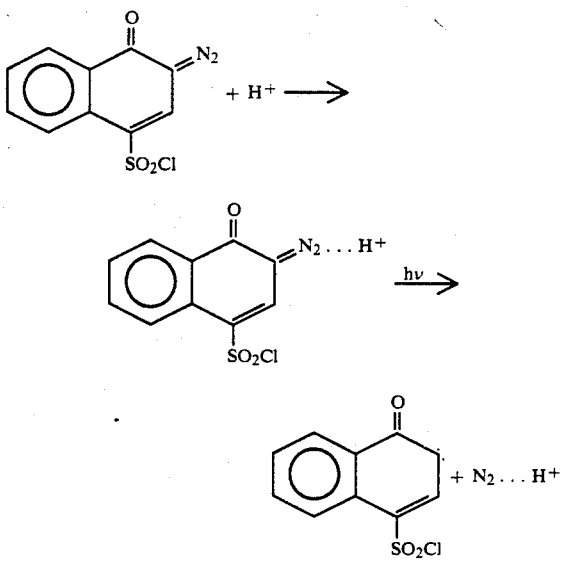

This the $C=N_2$ bond in the diazo group is weakened so that an unstable state of readily inducing elimination of the diazo group is brought about. That is, elimination of the diazo group occurs in a smaller exposure amount and a dissolution rate of the exposed area in an alkaline developing solution and its transmission increase concurrently. On the other hand, the unexposed area is in such a state that the diazo group is attracted by $H^+$ but the reaction of forming carboxylic acid accompanied by elimination of the diazo group does not occur so that the unexposed area is not dissolved in the alkaline developing solution.

Therefore, the dissolution rate and transmittance are increased only at the exposed area and as a result, the pattern-forming material provides high sensitivity and high transparency.

Furthermore, the present inventors made by way of trial pattern-forming materials having various pH values by changing a ratio of two solvents in this example to examine the significance of $H^+$ attraction. As a result, it was confirmed that the pattern-forming material having a pH of 4 or more showed less contribution due to the attraction of $H^+$ and did not obtain a great difference rom the conventional pattern-forming material. On the other hand, it was confirmed with the pattern-forming material having a pH adjusted to 4 or less that the $H^+$ attracting effect was extremely large and as a result, high sensitivity and high transparency were obtained. The relationship between pH values of pattern-forming materials and sensitivity as well as pattern aspect ratios is shown in the following table:

| Results | pH | | | |
|---|---|---|---|---|
| | 3.5 | 4.0 | 4.5 | 6.5 |
| Sensitivity (mJ/cm²) | 36 | 50 | 90 | 120 |
| Pattern aspect ratio (°) | 90 | 90 | 72 | 67 |

As is clearly noted from the table above, sensitivity and pattern aspect ratio can be greatly increased by adjusting the pH of the pattern-forming material to 4 or less.

EXAMPLE 2

A reagent was prepared in the following composition to prepare a pattern-forming material. A run similar to Example 1 was carried out.

| 1,2,4-Napthoquinone-diazosulfonic acid chloride | 3 g |
| Resin shown below | 7 g |
| $\{CH_2-CH\}_m\{CH-CH\}_n$ with phenyl, COOH, COOR; m:n = 1:1; R: cyclohexyl | |
| Ethyl cellosolve acetate | 20 g |

Figure 6:
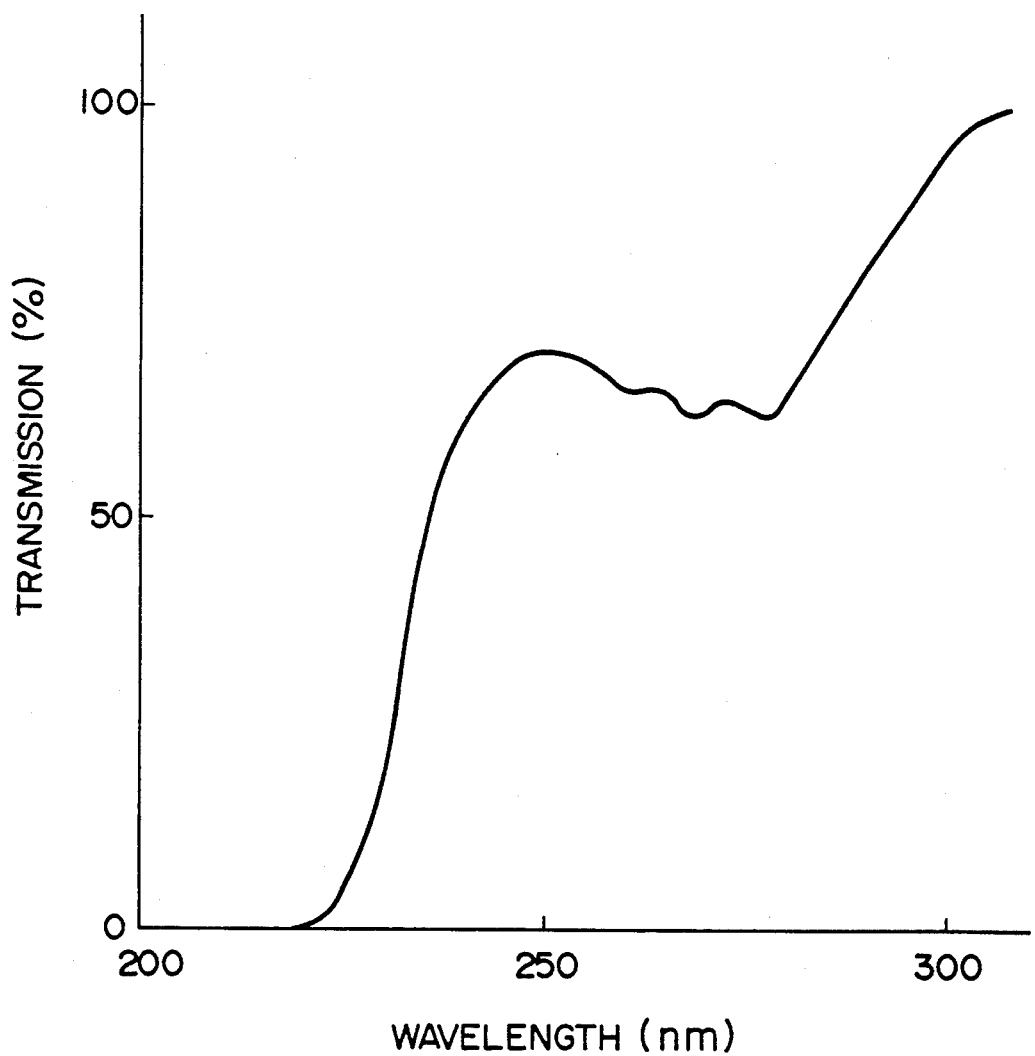
FIG. 6 shows a UV spectral curve for resin used for an example of the pattern-forming material of the present invention.

Since the resin described above contains carboxylic acid, the material is acidic and shows a pH value of 3.5. FIG. 6 shows a UV spectral curve of this pattern-forming material when the resin is coated to form a film having a thickness of 1 μm. The material shows as high as 70% at 248.4 nm, expecting good results as the resin used in pattern-forming materials for KrF excimer laser.

Using the pattern-forming material described above, a run similar to Example 1 was carried out. As a result, patterns as good as in Example 1 were obtained with high sensitivity. FIG. 7 shows a UV spectral curve of this pattern-forming material before and after exposure. The transmission at 248.4 nm after exposure was as extremely high as 55%.

EXAMPLE 3

A reagent was prepared in the following composition to prepare a pattern-forming material. A run similar to Example 1 was carried out.

| | |
|---|---|
| 1,2,4-Naphthoquinone-diazosulfonic acid chloride | 3 g |
| Novolak resin | 7 g |
| Sulfuric acid | 0.1 g |
| Ethyl cellosolve acetate | 20 g |

As the result of the run, good results were obtained as in Example 1.

EXAMPLE 4

A reagent was prepared in the following composition to prepare a pattern-forming material. A run similar to Example 1 was carried out.

| | |
|---|---|
| 1,2,4-Naphthoquinone-diazosulfonic acid chloride | 3 g |
| Novolak resin | 7 g |
| Benzoic acid | 0.05 g |
| Ethyl cellosolve acetate | 20 g |

As the result of the run, good results were obtained as in Example 1.

EXAMPLE 5

A reagent was prepared in the following composition to prepare a pattern-forming material. A run similar to Example 1 was carried out.

| | |
|---|---|
| 1,2,4-Naphthoquinone-diazosulfonic acid chloride | 3 g |
| Novolak resin | 7 g |
| 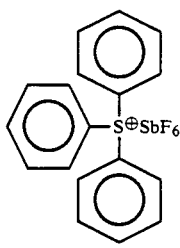 | 0.05 g |
| Ethyl cellosolve acetate | 20 g |

As the result of the run, good results were obtained as in Example 1.

EXAMPLE 6

A reagent was prepared in the following composition to prepare a pattern-forming material. A run similar to Example 1 was carried out.

| | |
|---|---|
| 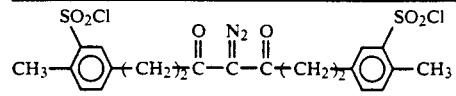 | 1.5 g |
| Novolak resin (MW: 5000) | 8.5 g |
| Acetic acid | 30 g |

As the result, submicron patterns having a good shape were obtained with high sensitivity (30 mJ/cm$^2$).

EXAMPLE 7

A reagent was prepared in the following composition to prepare a pattern-forming material. A run similar to Example 1 was carried out.

| | |
|---|---|
| 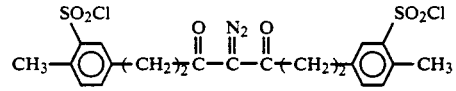 | 1.5 g |
| Half ester resin of styrene and maleic acid | 8.5 g |
| Diethyleneglycol dimethyl ether | 30 g |

As the result, submicron patterns having a good shape were obtained with high sensitivity (30 mJ/cm$^2$).

EXAMPLE 8

A reagent was prepared in the following composition to prepare a pattern-forming material. A run similar to Example 1 was carried out.

| | |
|---|---|
| 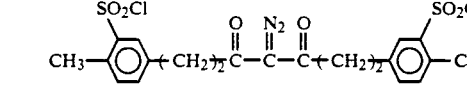 | 1.5 g |
| Half ester resin of styrene and maleic acid | 8.5 g |
| Sulfuric acid | 0.1 g |
| Diethyleneglycol dimethyl ether | 30 g |

As the result, submicron patterns having a good shape were obtained with high sensitivity (25 mJ/cm$^2$).

EXAMPLE 9

A reagent was prepared in the following composition to prepare a pattern-forming material. A run similar to Example 1 was carried out.

| | |
|---|---|
| 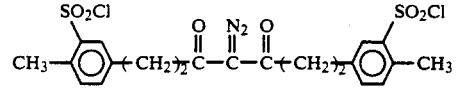 | 1.5 g |
| Half ester resin of styrene and maleic acid | 8.5 g |
| Benzoic acid | 0.1 g |
| Diethyleneglycol dimethyl ether | 30 g |

As the result, submicron patterns having a good shape were obtained with high sensitivity (25 mJ/cm$^2$).

EXAMPLE 10

A reagent was prepared in the following composition to prepare a pattern-forming material. A run similar to Example 1 was carried out.

| | |
|---|---|
| CH₃—⟨phenyl-SO₂Cl⟩—(CH₂)₂—C(=O)—C(=N₂)—C(=O)—(CH₂)₂—⟨phenyl-SO₂Cl⟩—CH₃ | 1.5 g |
| Half ester resin of styrene and maleic acid | 8.5 g |
| (triphenyl)S⁺ SbF₆⁻ | 0.1 g |
| Diethyleneglycol dimethyl ether | 30 g |

As the result, submicron patterns having a good shape were obtained with high sensitivity (15 mJ/cm²).

EXAMPLE 11

A reagent was prepared in the following composition to prepare a pattern-forming material. A run similar to Example 1 was carried out.

| | |
|---|---|
| CH₃—⟨phenyl-SO₂Cl⟩—(CH₂)₂—C(=O)—C(=N₂)—C(=O)—(CH₂)₂—⟨phenyl-SO₂Cl⟩—CH₃ | 1.5 g |
| Half ester resin of styrene and maleic acid | 8.5 g |
| 2,4-dinitrobenzyl-O-SO₂—⟨phenyl⟩—CH₃ | 0.1 g |
| Diethyleneglycol dimethyl ether | 30 g |

As the result, submicron patterns having a good shape were obtained with high sensitivity (20 mJ/cm²).

EXAMPLE 12

A run was performed in a manner similar to Example 10 except that the substrate was baked on a hot plate of 100° C. for 90 seconds after patternwise exposure. As the result, submicron patterns having an aspect ratio of 90° were obtained with high sensitivity (about 30 mJ/cm²).

EXAMPLE 13

A run was performed in a manner similar to Example 11 except that the substrate was baked on a hot plate of 100° C. for 90 seconds after patternwise exposure. As the result, submicron patterns having an aspect ratio of 90° were obtained with high sensitivity (about 32 mJ/cm²).

In the above examples, the method of the present invention was explained using as the photosensitive compounds 1,2,4-naphthoquinonediazosulfonic acid chloride and 1,7-bis(3-chlorosulfonyl-4-methylphenyl)-4-diazo-3,5-hepta nedione but any diazo compound is usable. Further in the examples, the method was explained using acetic acid, resin containing a carboxylic acid in the molecule thereof, sulfuric acid and benzoic acid as the acidic compounds; however, the acidic compounds are not limited to these exemplified acids. Likewise, the compounds that release acids by exposure are not limited to triphenyl antimony salt and 2,6-dinitrobenzyl tosylate compound, though the method was explained in the examples using these compounds.

What is claimed is:

1. A method for forming high sensitivity positive patterns, which comprises:

forming on a substrate a film of a pattern-forming material, said pattern-forming material consisting of, in admixture, a photosensitively reactively effective amount of a photosensitive compound containing the following $$-\underset{\underset{O}{\|}}{C}-\underset{\underset{N_2}{\|}}{C}-\underset{\underset{O}{\|}}{C}-$$

as a photosensitive group, a reactively effective amount of an alkaline-soluble polymer, a pH adjustingly effective amount of a compound capable of adjusting the pH of said pattern-forming material to 4 or less with or without exposure to light and a solvent capable of dissolving said photosensitive compound, said alkaline-soluble polymer and said compound capable of adjusting the pH of said pattern-forming material;

exposing the pattern-forming material applied on said substrate to light of about 248.4 nm of accelerate the reactivity of a photosensitive compound; and developing the exposed pattern-forming material with an alkaline developing solution.

2. The method according to claim 1, wherein said light of about 248.4 nm is a KrF excimer.

3. The method according to claim 1, wherein said alkaline-soluble polymer is selected from the group consisting of a novolak resin, poly-p-vinylphenol and a half ester resin of styrene and maleic acid.

4. The method according to claim 1, wherein said compound capable of adjusting the pH of said pattern-forming material to 4 or less with or without exposure to light is selected from the group consisting of an onium salt and nitrobenzyl tosylate.

5. The method according to claim 1, wherein said solvent is selected from the group consisting of diethyleneglycol dimethyl ether, ethyl cellosolve acetate and ethyl acetate.

* * * * *